United States Patent
McRae

(10) Patent No.: US 9,196,855 B2
(45) Date of Patent: Nov. 24, 2015

(54) ZONE BACKLIGHTING FOR LCD DISPLAYS LCD DISPLAYS THROUGH USE OF FIELD-INDUCED POLYMER ELECTRO LUMINESCENCE PANELS

(71) Applicant: Vizio Inc, Irvine, CA (US)

(72) Inventor: Matthew McRae, Irvine, CA (US)

(73) Assignee: Vizio Inc, Irvine, CA (US)

( * ) Notice: Subject to any disclaimer, the term of this patent is extended or adjusted under 35 U.S.C. 154(b) by 323 days.

(21) Appl. No.: 13/801,436

(22) Filed: Mar. 13, 2013

(65) Prior Publication Data

US 2014/0267939 A1    Sep. 18, 2014

(51) Int. Cl.
*G02F 1/133* (2006.01)
*H01L 51/50* (2006.01)
*G02F 1/1335* (2006.01)
*H01L 51/00* (2006.01)

(52) U.S. Cl.
CPC ...... *H01L 51/5016* (2013.01); *G02F 1/133603* (2013.01); *H01L 51/0048* (2013.01); *H01L 51/0085* (2013.01)

(58) Field of Classification Search
CPC .............. G02F 2001/133601; G02F 1/133603; H01L 51/5016; H01L 51/0048; H01L 51/0085
USPC .......................................................... 349/69
See application file for complete search history.

(56) References Cited

U.S. PATENT DOCUMENTS

| | | | |
|---|---|---|---|
| 7,052,152 B2 | 5/2006 | Harbers et al. | |
| 7,671,832 B2 | 3/2010 | Lankhorst et al. | |
| 8,092,064 B2 | 1/2012 | Erchak et al. | |
| 8,224,391 B2 | 7/2012 | Kim et al. | |
| 8,288,937 B2 | 10/2012 | Ishii et al. | |
| 8,300,177 B2 | 10/2012 | Takemoto et al. | |
| 8,334,942 B2 | 12/2012 | Aoki | |
| 2007/0047219 A1 | 3/2007 | Thompson et al. | |
| 2008/0151144 A1* | 6/2008 | Hirose et al. | 349/69 |
| 2010/0165001 A1 | 7/2010 | Savvateev et al. | |
| 2010/0207933 A1* | 8/2010 | Suzuki et al. | 345/214 |
| 2010/0214762 A1 | 8/2010 | Nevitt et al. | |

FOREIGN PATENT DOCUMENTS

| | | |
|---|---|---|
| EP | 1698914 | 9/2006 |
| EP | 1722267 | 11/2006 |

OTHER PUBLICATIONS

Effect of multi-walled carbon nanotubes on electron injection and charge generation in AC field-induced polymer electroluminescence Yonghua Chen, Gregory M. Smith, Eamon Loughman, Yuan Li, Wanyi Ni, David L. Carroll.

* cited by examiner

*Primary Examiner* — James Dudek
(74) *Attorney, Agent, or Firm* — Law Office of Scott C Harris, Inc

(57) ABSTRACT

A display system, having an emissive body, emitting light over a complete surface as part of a display system. The emissive body can be a FIPEL type device with a first transparent conductive coating over a light emitting substrate. A transparent substrate, has first and second surfaces, with the first surface coupled to the first transparent conductive coating, and the second surface of said transparent substrate including a surface formed with plural light channeling structures thereon.

41 Claims, 4 Drawing Sheets

ZONE BACKLIGHTING FOR LCD DISPLAYS LCD DISPLAYS THROUGH USE OF FIELD-INDUCED POLYMER ELECTRO LUMINESCENCE PANELS

BACKGROUND

Current local area or zone dimming direct LED backlight systems contain from dozens to hundreds of individual LEDs, supporting circuitry and other components.

Some LED direct back light panels have each LED or groups of LEDs controlled where black areas of a scene do not have light attempting to pass through the LCD display. Controlling single or groups of LEDs is referred to as local dimming or zone dimming.

Direct LED backlight systems are relatively thick in profile and generally have a diffuser sheet sitting in front of the backlighting panel to soften and mix the light from the panel to eliminate any banding of the emitted light. The assembly may further have another sheet or film with micro prisms and/or micro lens to help steer the light directly to the LCD panel which improves the efficiency of the emitted light from the backlight panel. Between the individual panels, sheets and films, there are often air gaps to allow the light to mix into more of a homogenous beam before entering the next sheet or film.

SUMMARY

The present invention explains replacing local area or zone direct LED backlight panels for LCD displays. These displays are used for televisions, desktop and laptop computer displays, tablet computers, appliance and consumer electronics devices, PDAs, mobile devices such as cell phones and wired and wireless telephones, PDAs, instrument displays for vehicles and various test equipment devices, large commercial display such as stadium displays, add on lightings such as television back directed lighting and bezel lighting and other various lighting through back lighted display panels.

A simpler apparatus, methods and systems are needed to produce a back lighting device that is less expensive, has a substantially lower parts count, is thinner, lighter in weight and more power efficient than current direct LED back lighting devices and systems.

DETAILED DESCRIPTION

The present invention is based on Field-Induced Polymer Electro-Luminescence (FIPEL) technology. FIPEL was developed as an area lighting device that produces larger quantities of light for a given size panel than previous electroluminescence (EL) panels which are well known in the art. FIPEL panels operate on alternating current. The frequency of the current is higher than 60 or 50 Hz normally used to power EL panels.

Current direct LED backlight panels are relatively heavy and contain substantially more components compared to LED edge lit backlight panels but with local area or zone dimming have an advantage over edge lit panels in that the contrast ratio is much higher.

Figure 1:
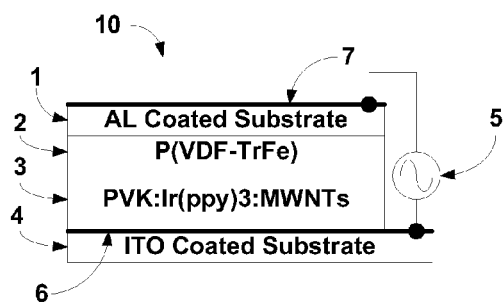
FIG. 1 is a depiction of an asymmetrical (single dielectric layer) FIPEL device that emits light from one surface.
Figure 2:
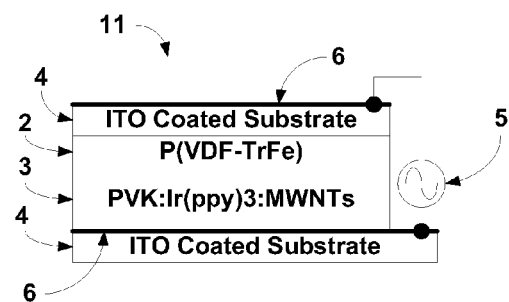
FIG. 2 is a depiction of an asymmetrical (single dielectric layer) FIPEL device that emits light from two surfaces.

To appreciate the simplicity of FIPEL devices reference FIGS. 1 and 2.

FIGS. 1 and 2 illustrate single dielectric FIPEL devices. The basic construction of these FIPEL devices is discussed in the following.

Lab quality FIPEL devices are generally fabricated on glass or suitable plastic substrates with various coatings such as aluminum and Indium tin oxide (ITO). ITO is a widely used transparent conducting oxide because of its two chief properties, it is electrical conductive and optical transparent, as well as the ease with which it can be deposited as a thin film onto substrates. Because of this, ITO is used for conducting traces on the substrates of most LCD display screens. As with all transparent conducting films, a compromise must be made between conductivity and transparency, since increasing the thickness increases the concentration of charge carriers which in turn increases the material's conductivity, but decreases its transparency. The ITO coating used for the lab devices discussed here is approximately 100 nm in thickness. In FIG. 1, emissive side substrate 4 is coated with ITO coating 6 residing against PVK layer 3. In FIG. 2, ITO coating 6 is on both substrates as shown.

Figure 3:
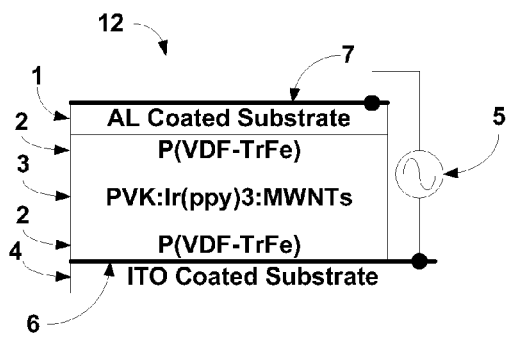
FIG. 3 is a depiction of a symmetrical (two dielectric layers) FIPEL device that emits light from one surface.
Figure 4:
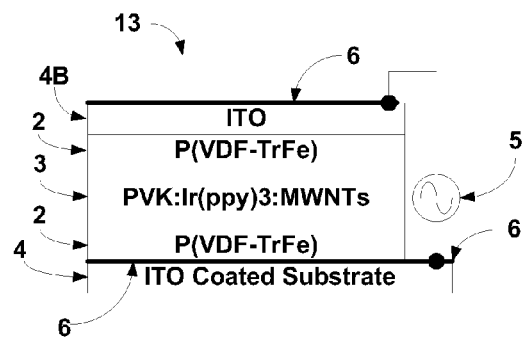
FIG. 4 is a depiction of a symmetrical (two dielectric layers) FIPEL device that emits light from two surfaces.

Substrate 1 in FIGS. 1 and 3 is coated with aluminum (AL) coating 7. The resulting thickness of the AL deposition is sufficient to be optically opaque and reflective. To ensure that any light from emissive layer 3 that travels toward substrate 1 is reflected and directed back through emissive substrate 4 with ITO coating 6 for devices illustrated in FIG. 1. If it is desired that light be emitted through both substrates, a substrate 4 with an ITO coating 6 will be substituted for substrate 1 with AL coating 5 as shown in FIG. 2.

The differences between the two similar substrates is how ITO coating 6 is positioned. In FIG. 1, emissive ITO coating 6 is positioned such that ITO coating 6 on substrate 4 is physically in contact with PVK layer 3. In FIG. 2, substrate 1 with Al coating 7 (FIG. 1) is replaced with substrate 4 with ITO coating 6 not in physical contact with the P(VDF-TrFe) (dielectric layer) layer 2. This allows light to be emitted from both the top and bottom surfaces of the FIPEL device.

Dielectric layer 2 in all cases is formed of a copolymer of P(VDF-TrFE) (51/49%). The dielectric layer is generally spin coated against the non-AL coated 7 side of substrate 1 or non-ITO coated 6 of substrate 4 of the top layer (insulated side). In all cases the dielectric layer is approximately 1,200 nm thick.

Emissive layer 3 is formed of a mix polymer base of poly (N-vinylcarbazole):fac-tris(2-phenylpyri-dine)iridium(III) [PVK:Ir(ppy)3] with Medium Walled Nano Tubes (MWNT). The emissive layer coating is laid onto the dielectric layer to a depth of approximately 200 nm. For the lab devices with the greatest light output the concentration of MWNTs to the polymer mix is approximately 0.04% by weight.

When an alternating current is applied across the devices shown in FIGS. 1 and 2 (asymmetrical devices containing 1 dielectric layer) the emissive layer emits light at specific wavelengths depending on the frequency of the alternating current. The alternating current is applied across the conductive side of the top substrate 1 (Al coating 7) or substrate 4 and the conductive side (ITO coating 6) of bottom substrate 4. Light emission comes from the injection of electrons and holes into the emissive layer. Holes follow the PVK paths in the mixed emissive polymer and electrons follow the MWNTs paths.

The frequency of the alternating current applied across the substrates of the FIPEL panel can also determine the color of light emitted by the panel. Any index on the CIE can be duplicated by selecting the frequency of the alternating current. Signal generator 5 may be of a fixed frequency set by electronic components or set by a computer process that is software controlled. In this embodiment, the controlling software may consist of algorithms to balance white color or may determine the frequency based on hardware registers or data contained in the digital stream transporting the content to be displayed.

Carriers within the emissive layer then recombine to form excitons, which are a bound state of an electron and hole that are attracted to each other by the electrostatic force or field in the PVK host polymer, and are subsequently transferred to the Ir(ppy)3 guest, leading to the light emission.

Figure 7:
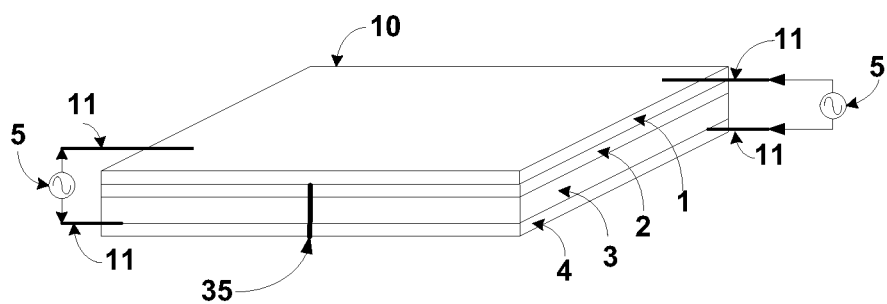
FIG. 7 is a depiction of two adjacent FIPEL cells that share a common back substrate that is aluminum coated.
Figure 8:
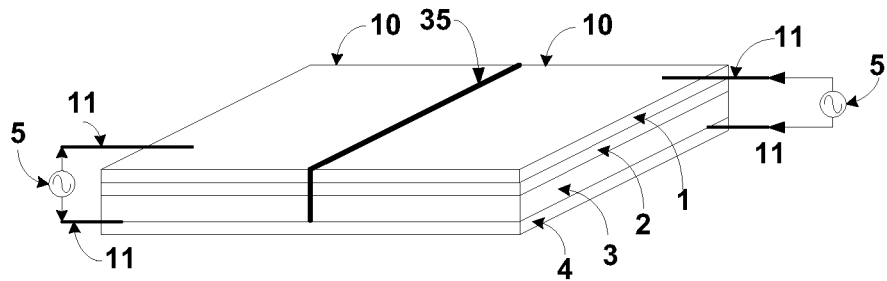
FIG. 8 is a depiction of two adjacent FIPEL cells that share a common front substrate which is the emissive side substrate.

FIGS. 7 and 8 illustrate an embodiment using common substrates for adjacent FIPEL panels.

FIG. 7 depicts an embodiment where adjacent FIPEL panels separated by insulator 35, share back substrate 1 which is coated with aluminum 7 or ITO 6. In this embodiment, common substrate 1 acts as a single signal path to all of the panels. This embodiment decreases the parts count for control signal traces to each of the individual FIPEL panels. For a panel that is 1080×1,920 the resulting decrease in the number of control lines is 2,073,599. Individual substrate 4 with ITO coating 6 acts as the controlled substrate for individual FIPEL pixels.

FIG. 8 depicts an embodiment where emissive substrate 4 with ITO coating 6 as the common substrate for the two units separated by insulator 35. In this embodiment, substrate 1 with aluminum coating 7 is the controlled substrate for individual FIPEL pixels.

The present invention enhances the basic FIPEL device for direct backlight systems. High definition LCD television displays are available in different aspect ratios such as 16×9 and 21×9. 16×9 aspect ratio display screens contain 1,080 pixels horizontally and 1,920 pixels vertically. 21×9 aspect ratio display screens contain 1,080 pixels horizontally and 2,560 pixels vertically.

Embodiments to be described are directed toward displays that are 16×9 but are equally related to 21×9 wide displays or to any other size of display.

Figure 5:
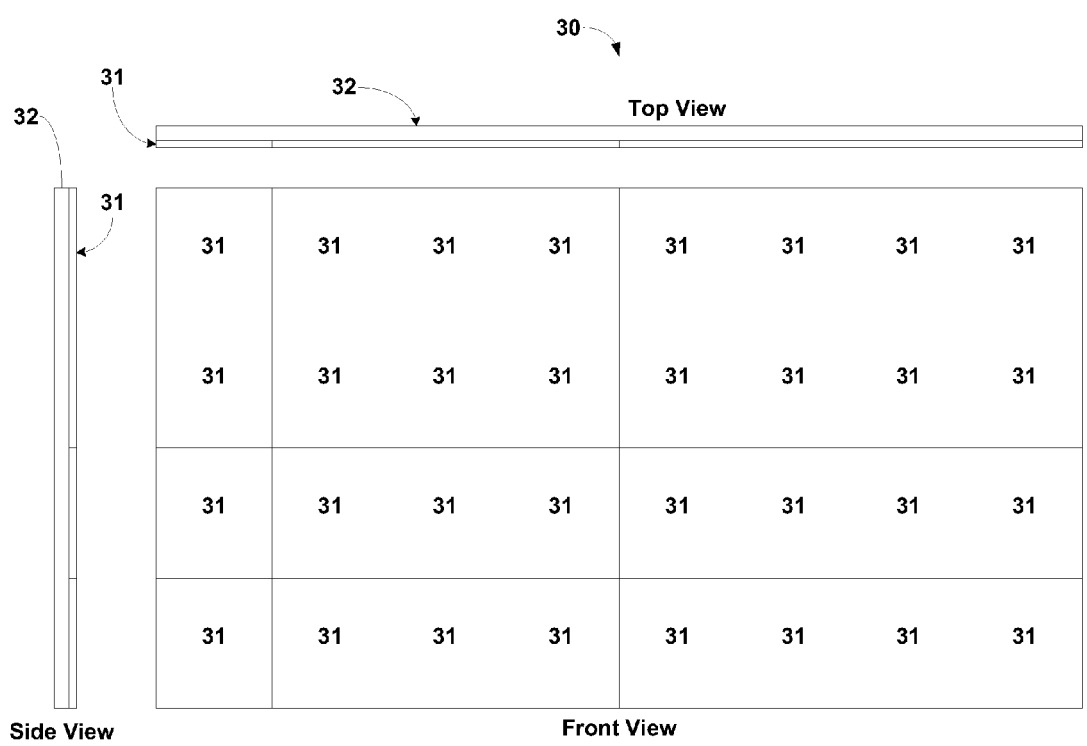
FIG. 5 is a depiction of a FIPEL backlight panel with 32 individual FIPEL panels for zone lighting.

A preferred embodiment is shown in FIG. 5, which depicts a front view of a 16×9 display and a side edge and top edge view of the same display. Note that this embodiment uses 32 individual FIPEL panels to provide back lighting to a spatial light modulator, here, a LCD array panel which is not shown for the sake of clarity.

In FIG. 5, the back or non-emitting surface of the panel is represented as 32. This is substrate 1 shown in FIG. 1 and is the substrate with reflective coating 7 such as aluminum on its back surface which also acts as a conducting surface. In this embodiment of the invention, substrate 1 is common to all of the FIPEL panels represented as 32. FIPEL panels 31 are 32 individual panels with a common back substrate 32. The layers of each of the 32 FIPEL panels contain emitting substrate 4 with ITO coating 6 followed by emissive layer 3 as shown in FIG. 1 followed by dielectric layer 2. All of FIPEL panels 31 use a common non-emitting surface or substrate 1 with aluminum coating 7. In effect, non-emitting surface/substrate 32 is used much like a common ground or signal return.

Figure 6:
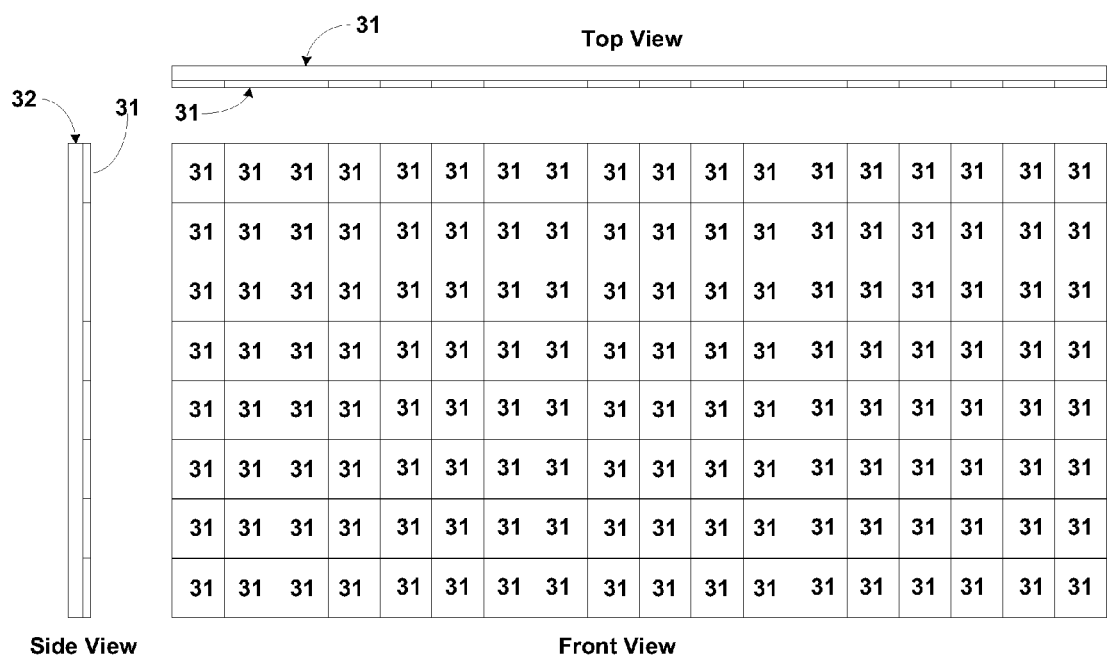
FIG. 6 is a depiction of a FIPEL backlight panel with 144 individual FIPEL panels for zone lighting.

FIG. 6 is a variation on the backlight panel depicted in FIG. 5 with the exception that FIG. 6 depicts a multi-segment FIPEL backlight system with 18 FIPEL panel columns and 8 FIPEL panel rows giving a total of 144 FIPEL panels, all of which share a common substrate.

Table 1 shows the number of full pixels for different numbers of light emitting panels across the width of the display for a 16×9 aspect ratio display and the number of full pixels for different numbers of light emitting panels vertically. The table basically shows the number of columns possible that will divide the screen into whole pixels horizontally and shows the number of rows that will divide the screen into whole pixels vertically.

TABLE 1

| Cols | Pixels Tile Col | Rows | Pixels Tile Row |
|------|-----------------|------|-----------------|
| 1    | 1,080           | 1    | 1,920           |
| 8    | 135             | 2    | 960             |
| 9    | 120             | 3    | 640             |
| 10   | 108             | 4    | 480             |
| 12   | 90              | 6    | 320             |
| 15   | 72              | 8    | 240             |
| 18   | 60              | 12   | 160             |
| 20   | 54              | 16   | 120             |
| 24   | 45              | 20   | 96              |
| 27   | 40              | 24   | 80              |
| 30   | 36              | 32   | 60              |
| 36   | 30              | 40   | 48              |
| 40   | 27              | 48   | 40              |
| 45   | 24              | 64   | 30              |
| 54   | 20              | 80   | 24              |
| 60   | 18              | 96   | 20              |
| 72   | 15              | 120  | 16              |
| 90   | 12              | 128  | 15              |
| 108  | 10              | 160  | 12              |
| 120  | 9               | 192  | 10              |
| 135  | 8               | 240  | 8               |
| 216  | 5               | 320  | 6               |
| 270  | 4               | 384  | 5               |
| 540  | 2               | 480  | 4               |
| 1080 | 1               | 640  | 3               |
|      |                 | 960  | 2               |
|      |                 | 1920 | 1               |

FIG. 5 depicts a backlight panel with 32 individual FIPEL light emitting panels. This depiction uses an array of 8 panels per row and 4 panels per column. Again referencing Table 1, 8 panels horizontally and 4 panes vertically will provide light to 64,800 pixel groups (135 pixels per column by 240 pixels per row).

This means that each individual FIPEL panel 31 can provide light to a discrete area or zone of pixels.

In a variation of this embodiment, substrate 32 may be made up of an array of substrates such that each of the 32 FIPEL panels has its own substrate 1 as depicted in FIG. 1 and FIG. 5. This variation allows for at least two variations where in the first variation, a separate signal line is run from the conducting surface of substrate 1 to signal generator 5 for that panel. The last variation for this embodiment is that substrates 1 for each of the 32 FIPEL panels may be daisy changed to adjacent panels such that a single signal line is run to all of signal generators 5 for all 32 of the FIPEL panels.

Another embodiment of the invention is shown in FIG. 6. This embodiment shows a front view, side view and top view of a display panel with 144 individual FIPEL panels. In this embodiment there are 18 panels horizontally each of which is 60 pixels wide and 8 panels vertically which are 240 pixels high for a total of 14,400 pixels being illuminated by each FIPEL panel. This embodiment provides a granularity improvement of 4.5 times that of the 32 panel embodiment depicted in FIG. 5.

Referencing FIGS. 7 and 8, a depiction of two FIPEL panels is shown. Notice that reference number 5 shows a schematic depiction of a signal generator for each panel. Reference number 35 depicts an insulated separator between each of the panels.

FIG. 7 is a depiction of two adjacent FIPEL panels where panel separator insulator 35 does not divide substrate 1 with aluminum coating 7 as shown in FIG. 7. FIG. 6 is a depiction where substrate 4 with ITO coating 6 is the common element.

FIPEL technology can also be used with the new Samsung screen technology called Electro-wetting Displays which may have backlights or have only have reflective back surfaces that reflect ambient light. A FIPEL panel of the type shown in the embodiments can provide both. When the FIPEL panel is active with this type of display, the display is using a backlight when being used in low ambient light environments. When the FIPEL panel is turned off, the reflective back surface of the FIPEL panel is reflective when used in high ambient light environments. This gives the Electro-wetting Display the best of both worlds.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended for covering any modification or alternatives which might be predictable to a person having ordinary skill in the art. For example, other sizes and thicknesses can be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, display port, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory-computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display system, comprising:
    an emissive body, emitting light over a surface as part of a display system, said emissive body being formed of a first layer having multiple light emitting parts on the first layer, and insulation on the first layer between said multiple light emitting parts, each light emitting part being separately controlled to emit light separately and each light emitting part emitting a wavelength of light that is separately controlled from wavelengths of light of other light emitting parts, each of said light emitting parts forming a zone on said surface that is separately controllable to control light output from said zone, where each said zone is separated from an adjacent zone by a material that is part of the first layer forming the insulation; and
    a spatial light modulator, modulating the light from each of said zones of said emissive body.

2. The display system as in claim 1 wherein said emissive body is connected to said adjacent zone by a common substrate on a second layer of said emissive body, and where said common substrate forms a part of a signal path used to control said wavelengths of each of said zones.

3. The display system as in claim 1, wherein said emissive body emits light from both front and back.

4. The display system as in claim 1, wherein said emissive body is divided into 32 said zones.

5. The display system as in claim 1, wherein said emissive body is divided into 144 said zones.

6. The display system as in claim 1, wherein each said zone is separately controllable to control an amount of light output from the zone.

7. The display system as in claim 1, further comprising at least one signal generator, and wherein each said zone is separately controllable by changing a value of a frequency of said at least one signal generator to control wavelength of light output from the zone.

8. The display system as in claim 2, wherein the common substrate is a back panel.

9. The display system as in claim 2, wherein the common substrate is a front panel.

10. The display system as in claim 1, wherein said spatial light modulator is liquid crystal, forming a liquid crystal display.

11. The display system as in claim 10, wherein the display system is a television.

12. This display system as in claim 10 wherein the display system is in a portable computer.

13. The display system as in claim 12, wherein said portable computer is one of a tablet, cell phone, watch or PDA.

14. The display system as in claim 10, wherein said spatial light modulator is composed of elements that are one of: TFT, VA, IPS, IGZO or an electro-wetting device.

15. A method of forming a display comprising:
    controlling an emissive body to emit light separately over each of a plurality of zones forming a surface, each zone on said surface being separately controllable to control a wavelength of light output from said zone such that each said zone is separately wavelength controlled; and
    a spatial light modulator, modulating the light from each of said zones.

16. The method as in claim 15, further comprising controlling said emissive body to emit light from both front and back.

17. The method as in claim 15, wherein said emissive body is divided into 32 said zones.

18. The method as in claim 15, wherein said emissive body is divided into 144 said zones.

19. The method as in claim 15, wherein said zones are controlled by a substrate that is common to all said zones and forms part of a signal path to control said wavelengths of said zones.

20. The method as in claim 15, wherein each said zone is separately controllable to control amount of light output from the zone.

21. The method as in claim 15, further comprising at least one signal generator, and wherein said wavelength is controlled for each said zone is separately, by changing a value of a frequency of said at least one signal generator to control wavelength of light output from the zone.

22. The method as in claim 19, wherein the common substrate is a back panel.

23. The method as in claim 19, wherein the common substrate is a front panel.

24. The method as in claim 15, wherein said spatial light modulator is liquid crystal, forming a liquid crystal display.

25. The method as in claim 24, wherein the display is a television.

26. The method as in claim 24 wherein the display is in a portable computer.

27. The method as in claim 26, wherein said portable computer is one of a tablet, cell phone, watch or PDA.

28. The method as in claim 24, wherein said spatial light modulator is composed of elements that are one of: TFT, VA, IPS, IGZO or an electro-wetting device.

29. A display system, comprising:
an emissive body, having plural separately controllable zones, each of which are controlled to emit light having a separate wavelength, where each said zone is separated from an adjacent zone by an insulating material that is part of a first layer of said emissive body, and is connected to said adjacent zone by a common substrate on a second layer of said emissive body, where said second layer forms a part of a signal path used to control each of said zones; and
a spatial light modulator, modulating the light from each of said zones of said emissive body to create a display.

30. The display system as in claim 29, wherein said emissive body emits light from both front and back.

31. The display system as in claim 29, wherein said emissive body is divided into 32 said zones.

32. The display system as in claim 29, wherein said emissive body is divided into 144 said zones.

33. The display system as in claim 29, wherein each said zone is separately controllable to control amount of light output from the zone.

34. The display system as in claim 29, further comprising at least one signal generator, and wherein each said zone is separately controlled by a frequency of said at least one signal generator to control wavelength of light output from the zone.

35. The display system as in claim 29, wherein the common substrate is a back panel.

36. The display system as in claim 29, wherein the common substrate is a front panel.

37. The display system as in claim 29, wherein said spatial light modulator is liquid crystal, forming a liquid crystal display.

38. The display system as in claim 37, wherein the display system is a television.

39. This display system as in claim 37 wherein the display system is in a portable computer.

40. The display system as in claim 39, wherein said portable computer is one of a tablet, cell phone, watch or PDA.

41. The display system as in claim 37, wherein said spatial light modulator is composed of elements that are one of: TFT, VA, IPS, IGZO or an electro-wetting device.

* * * * *